(12) United States Patent
Lu

(10) Patent No.: US 6,788,166 B2
(45) Date of Patent: Sep. 7, 2004

(54) HARMONIC WAVE DISTORTION SUPPRESSOR

(75) Inventor: Shan-Jui Lu, Taipei Hsien (TW)

(73) Assignee: Lantek Electronics Inc., Taipei Hsien (TW)

( * ) Notice: Subject to any disclaimer, the term of this patent is extended or adjusted under 35 U.S.C. 154(b) by 38 days.

(21) Appl. No.: 10/372,261

(22) Filed: Feb. 25, 2003

(65) Prior Publication Data

US 2004/0066247 A1 Apr. 8, 2004

(30) Foreign Application Priority Data

Oct. 4, 2002 (TW) ....................................... 91215808 U

(51) Int. Cl.[7] .......................... H02J 1/02; H02M 1/12; H02H 1/04; H04B 1/58; H01G 2/10
(52) U.S. Cl. ...................... 333/119; 333/131; 333/177; 333/181; 361/16; 361/62; 361/301.3; 361/311; 361/321.1; 363/39; 307/105
(58) Field of Search ................................ 333/100, 119, 333/131, 177, 181, 20; 361/15, 16, 62, 301.3, 311, 321.1; 363/39; 307/105

(56) References Cited

U.S. PATENT DOCUMENTS 3,585,493 A * 6/1971 Moerlein ..................... 323/248
3,947,725 A * 3/1976 Lucas .......................... 361/17
4,394,631 A * 7/1983 Pavlic ......................... 333/132

* cited by examiner

Primary Examiner—Barbara Summons
(74) Attorney, Agent, or Firm—Troxell Law Office PLLC

(57) ABSTRACT

A harmonic wave distortion suppressor includes a main body, at least a connecting pin and a coating. The main body is made of a first material and covered with a second material for absorbing an instantaneous high voltage or sharp wave. The connecting pin is coupled to two lateral sides of the main body respectively so as to form a capacitor. The coating is coated on the main body locally with a clearance being exposed and the clearance provides a function of charging and discharging locally. When the high voltage or sharp wave passes through the harmonic wave distortion suppressor, peak discharging effect of the clearance can not only isolate the high voltage or sharp wave from entering an electronic device but also prevent an iron core in the electronic device from occurring magnetization effect resulting from the high voltage or sharp wave so that quality of signal transmission and receiving can be secured.

14 Claims, 3 Drawing Sheets

HARMONIC WAVE DISTORTION SUPPRESSOR

BACKGROUND OF THE INVENTION

1. Field of the Invention

The present invention relates to a harmonic wave distortion suppressor and particularly to a harmonic wave distortion suppressor in a distributor. The harmonic wave distortion suppressor is locally coated to restrain the harmonic wave distortion such that the high voltage or sharp wave passing through each port in the distributor is isolated and the iron core is prevented from magnetization during being passed through by the instantaneous high voltage so as to secure the quality of signal transmission and receiving for the wide frequency net system.

2. Description of Related Art

Referring to FIG. 1, a conventional sharp wave suppressing component 1 includes a main body 11, which is Zinc oxide printed silver electrode, at least a connecting pin 12 and a coating 13, which is coating material coated over the main body 11 entirely. The conventional sharp wave suppressing component 1 is possible to protect the circuit only and it is not possible to restrain the iron core in the distributor from occurring the phenomenon of magnetization during the iron core being passed through with the high voltage. However, the phenomenon of magnetization results in harmonic wave distortion. Besides, although the conventional sharp wave suppressor mounted in the distributor is limited by the available room and, mostly, the sharp wave suppressor component is designed to be grounded in order to protect the system, it is unable to be used for signal transmission and signal cross-connection.

SUMMARY OF THE INVENTION

Accordingly, the crux of the present invention is to a harmonic wave distortion suppressor, which includes a main body, at least a connecting pin and a coating. The main body is made of a first material and covered with a second material for absorbing an instantaneous high voltage or sharp wave. The connecting pin is coupled to two lateral sides of the main body respectively so as to form a capacitor. The coating is coated on the main body locally with a clearance being exposed and the clearance provides a function of charging and discharging locally. When the high voltage or sharp wave passes through the harmonic wave distortion suppressor, peak discharging effect of the clearance can not only isolate the high voltage or sharp wave from entering an electronic device but also prevent an iron core in the electronic device from occurring magnetization effect resulting from the high voltage or sharp wave so that quality of signal transmission and receiving can be secured.

BRIEF DESCRIPTION OF THE DRAWINGS

The present invention can be more fully understood by reference to the following description and accompanying drawings, in which.

DETAILED DESCRIPTION OF THE PREFERRED EMBODIMENT

Figure 2:
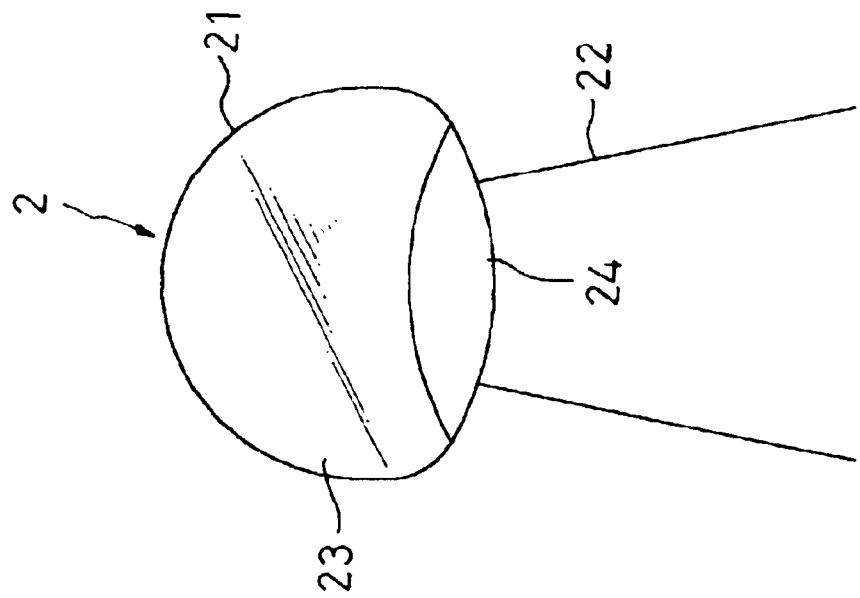
FIG. 2 is a plan view of a harmonic distortion suppressor according to the present invention.
Figure 1:
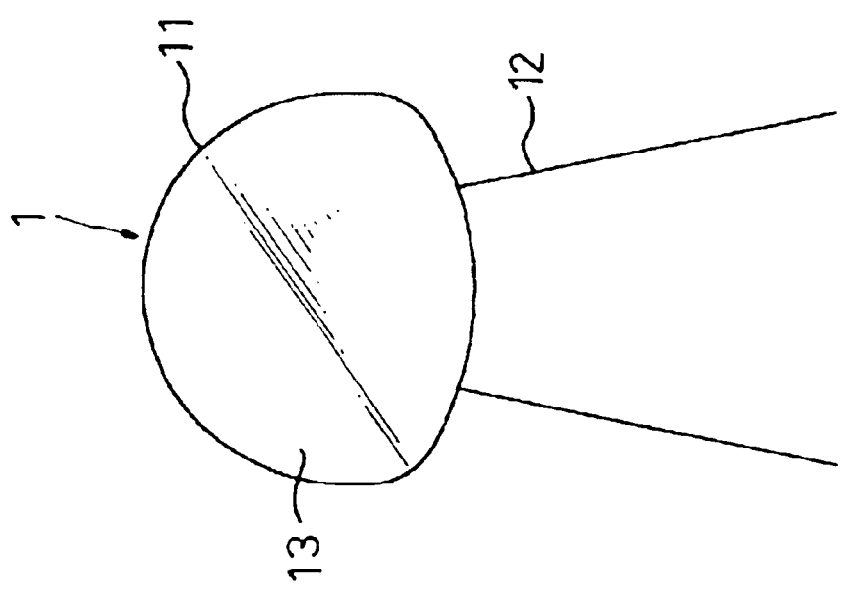
FIG. 1 is a plan view of a conventional sharp wave suppressing component.

Referring to FIG. 2, a harmonic distortion suppressor 2 according to the present invention includes a main body 21, at least a connecting pin 22, a coating 23 and a clearance 24.

Wherein, the main body 21 is a medium and preferably made of Barium Titanate with a layer of covering preferably made of silver powder for absorbing high voltage or a sharp wave. It is preferable that the layer of covering is attached to the main body by way of printing. The connecting pin 22 is coupled to two lateral sides of the main body 21 so as to form a capacitor for isolating the high voltage or the sharp wave and transmitting signal each other. The coating 23 is partly coated on the main body 21 and preferably made of epoxy resin with the clearance 24 being not coated. The clearance 24 provides a function of being capable of charging and discharging locally such that once the instantaneous high voltage or sharp wave in the wide frequency band net system passes through the harmonic wave distortion suppressor 2, the peak discharge effect of the clearance 24 can prevent not only the high voltage or the sharp wave from entering the distributor but also an iron core from the magnetization effect resulting from the high voltage or the sharp wave as shown in FIG. 3 so as to secure the quality of signal transmission and receiving.

Referring to FIG. 3 again, the distributor 3 includes an input end 31, a harmonic wave distortion suppressor 32, a first iron core 33, a second iron core 34, a harmonic wave distortion suppressor 35, a first output end 36, a harmonic wave distortion suppressor 37 and a second output end 38.

Wherein, the input end 31 is used for a signal being input and the harmonic wave distortion suppressor 32 at an end thereof is coupled to the input end 31 for restricting harmonic wave part in the input signal and preventing the high voltage or sharp wave from entering the distributor 3. The first iron core 33 is coupled to another end of the harmonic wave distortion suppressor 32 for filtering out noisy part of the signal. The second iron core 34 crossly connects with the first iron core 33 to obtain a cross-connecting signal and screen out noisy part in the cross-connecting signal. The harmonic wave distortion suppressor 35 at an end thereof is coupled to the second iron core 34 for restricting the harmonic wave part of the cross-connecting signal and preventing the high voltage or the sharp wave from being output via the distributor 3. The first output end 36 is coupled to another end of the harmonic wave distortion suppressor 35 for sending out the cross-connecting signal. The harmonic wave distortion suppressor 37 at an end thereof is coupled to the second iron core 34 for restricting the harmonic wave part in the cross-connecting signal and preventing the high voltage or sharp wave being output via the distributor 3. The second output end 38 is coupled to another end of the harmonic wave distortion suppressor for sending out the cross-connecting signal. Hence, the harmonic wave distortion suppressor of the present invention not only can prevent the high voltage or sharp wave from entering the distributor 3 but also is possible to connect with the iron cores 33, 34 in series for being capable of cross-connecting signals.

Figure 3:
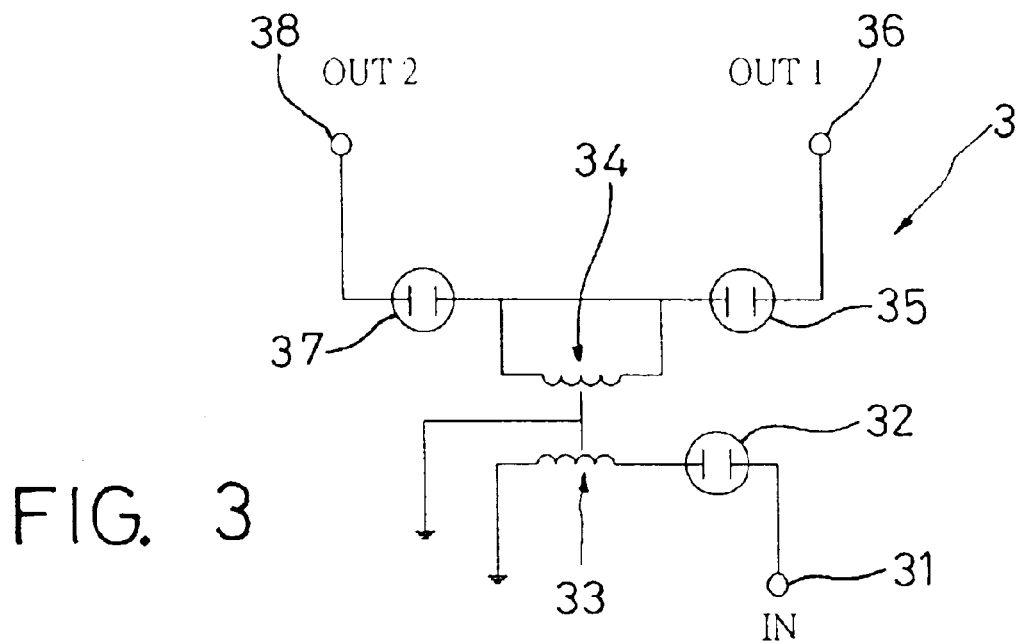
FIG. 3 is a circuit diagram of a distributor using the harmonic distortion suppressor of the present invention.
Figure 4:
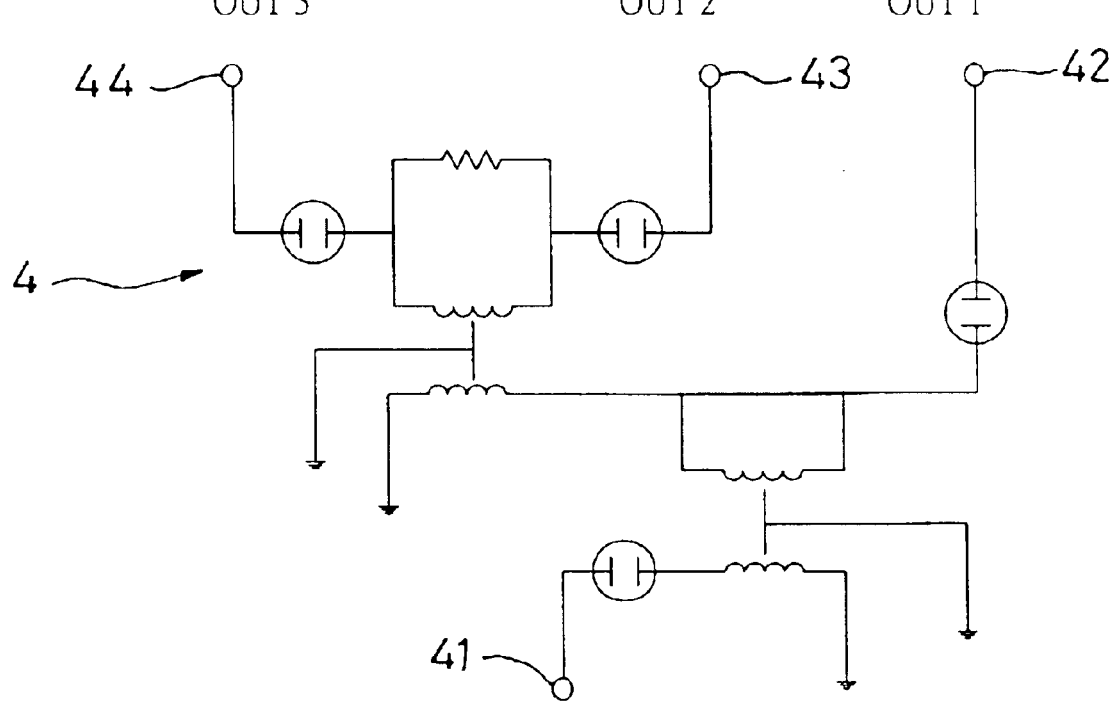
FIG. 4 is a circuit diagram of another distributor using the harmonic distortion suppressor of the present invention.

Referring to FIG. 4, the distributor 4 has an input end 41 and three output ends 42, 43, 44 and the principle of operating the distributor 4 is the same as that shown in FIG. 3.

Figure 5:
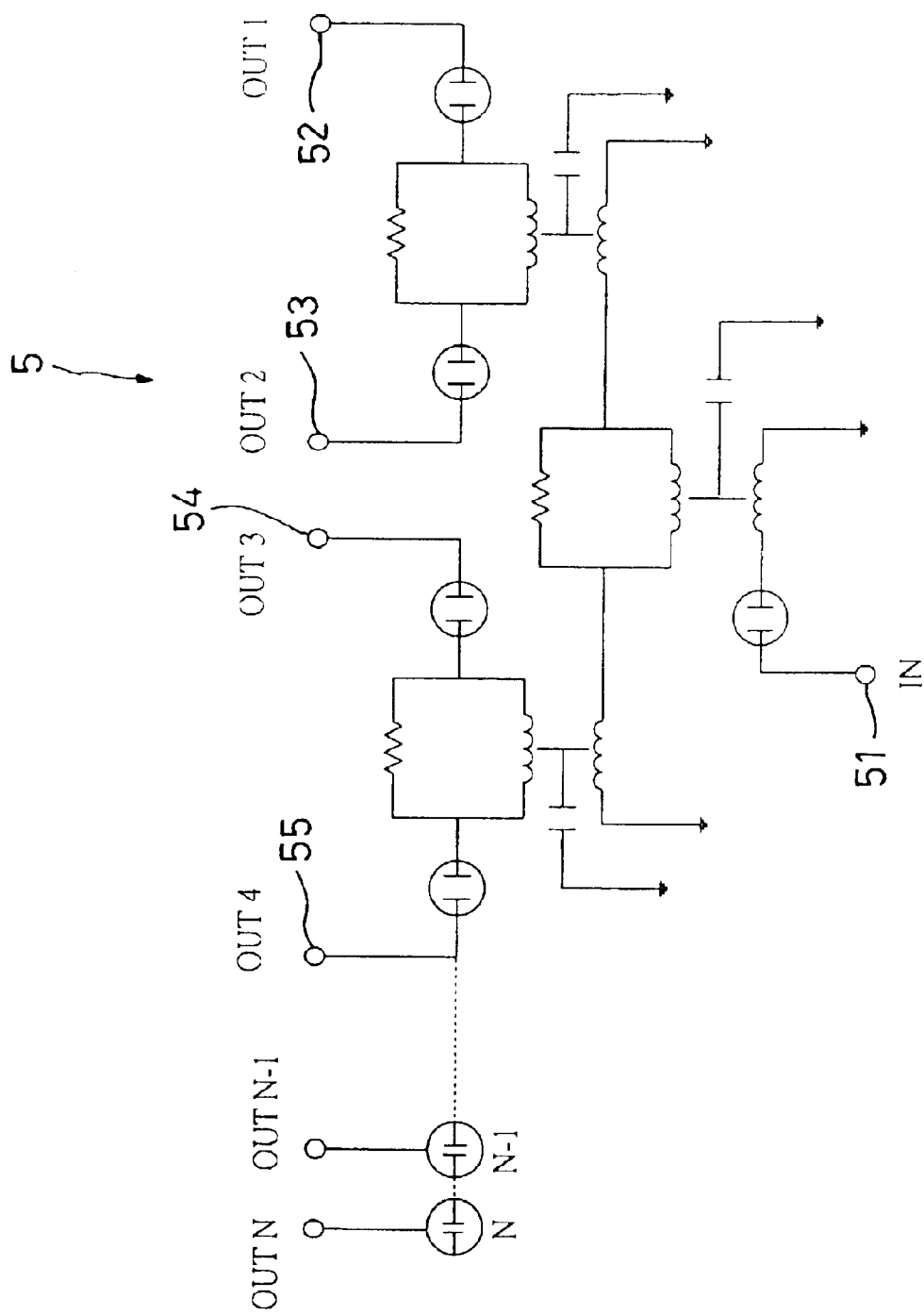
FIG. 5 is a circuit diagram of a further distributor using the harmonic distortion suppressor of the present invention.

Referring to FIG. 5, the distributor 5 has an input end 51 and N pieces of output ends 52, 53, . . . , OUT N and the principle of operating the distributor 5 is also the same as that shown in FIG. 3.

It is appreciated that the harmonic wave distortion suppressor according to the present invention provides an arrangement with local coating and the function of restricting the harmonic wave distortion can be obtained so that it is possible not only to isolate the high voltage or sharp wave, which passes through each port of the distributor, but also to prevent the phenomenon of magnetization resulting from the iron core being passed through with the high voltage. Therefore, the quality of signal transmission and receiving in the net with wide frequency band can be secured effectively.

While the invention has been described with reference to preferred embodiments thereof, it is to be understood that modifications or variations may be easily made without departing from the spirit of this invention, which is defined by the appended claims.

What is claimed is:

1. A harmonic wave distortion suppressor, comprising:
   a main body, being made of a first material and being covered with a second material for absorbing an instantaneous high voltage or sharp wave:
   a least a connecting pin, being coupled to two lateral sides of the main body respectively so as to form a capacitor; and
   a coating, being coated on the main body locally with a clearance being exposed and the clearance providing a function of charging and discharging locally,
   whereby, when the high voltage or sharp wave passes through the harmonic wave distortion suppressor, peak discharging effect of the clearance can not only isolate the high voltage or sharp wave from entering an electronic device but also prevent an iron core in the electronic device from occurring magnetization effect resulting from the high voltage or sharp wave so that quality of signet transmission and receiving can be scoured.

2. The harmonic wave distortion suppressor as defined in claim 1, wherein the first material is Barium Titanate.

3. The harmonic wave distortion suppressor as defined in claim 1, wherein the second material is silver powder.

4. The harmonic wave distortion suppressor as defined in claim 1, wherein the second material is covered on the first material by way of printing.

5. The harmonic wave distortion suppressor as defined in claim 1, wherein the coating is made of epoxy resin.

6. The harmonic wave distortion suppressor as defined in claim 1, wherein the electronic device is a distributor.

7. A distributor capable of suppressing harmonic wave distortion, comprising:
   an input end, being input a signal;
   a harmonic wave distortion suppressor, having an end being coupled to the input end for restricting a harmonic wave part of the signal and preventing a high voltage or sharp wave from entering the distributor;
   a first iron core, being coupled to another end of the harmonic wave distortion suppressor for filtering noisy signet part in the signal;
   a second iron core, cross-connecting with the first iron core to obtain a cross-connecting signal and filtering noisy signal part in the cross-connecting signal; and
   at least an output part, being coupled to the second iron core for sending out the cross-connecting signal.

8. The distributor capable of suppressing harmonic wave distortion according to claim 7, wherein the output part further comprises:
   a harmonic wave distortion suppressor, an end thereof being coupled to the second iron core for restricting harmonic wave part and a high voltage or sharp wave in the cross-connecting signal; and
   an output end, being coupled to another end of the harmonic wave distortion suppressor for sending out the cross-connecting signal.

9. The distributor capable of suppressing harmonic wave distortion according to claim 8, wherein the harmonic wave distortion suppressor further comprises:
   a main body, being made of a first material and being covered with a second material for absorbing an instantaneous high voltage or sharp wave;
   at least connecting pin, being coupled to two lateral sides of the main body respectively so as to form a capacitor; and
   a coating, being coated on the main body locally with a clearance being exposed and the clearance providing a function of charging and discharging locally;
   whereby, when the high voltage or sharp wave passes through the harmonic wave distortion suppressor, peak discharging effect of the clearance can not only isolate the high voltage or sharp wave from entering the distributor but also prevent the first and the second iron cores in the distributor from occurring magnetization effect resulting from the high voltage or sharp wave so that quality of signal transmission and receiving can be secured.

10. The distributor capable of suppressing harmonic wave distortion according to claim 7, wherein the harmonic wave distortion suppressor further comprises:
    a main body, being made of a first material and being covered with a second material for absorbing an instantaneous high voltage or sharp wave;
    at least a connecting pin, being coupled to two lateral sides of the main body respectively so as to form a capacitor; and
    a coating, being coated on the main body locally with a clearance being exposed and the clearance providing a function of charging and discharging locally;
    whereby, when the high voltage or sharp wave passes through the harmonic wave distortion suppressor, peak discharging effect of the clearance can not only isolate the high voltage or sharp wave from entering the distributor but also prevent the first and the second iron cores in the distributor from occurring magnetization effect resulting from the high voltage or sharp wave so that quality of signal transmission and receiving can be secured.

11. The harmonic wave distortion suppressor as defined in claim 10, wherein the first material is Barium Titanate.

12. The harmonic wave distortion suppressor as defined in claim 10, wherein the second material is silver powder.

13. The harmonic wave distortion suppressor as defined in claim 10, wherein the second material is covered on the first material by way of painting.

14. The harmonic wave distortion suppressor as defined in claim 10, wherein the coating is made of epoxy resin.

* * * * *